United States Patent
Toth et al.

(10) Patent No.: US 11,662,154 B2
(45) Date of Patent: May 30, 2023

(54) VAPOR CHAMBER THERMAL STRAP ASSEMBLY AND METHOD

(71) Applicant: Aavid Thermal Corp., Wilmington, DE (US)

(72) Inventors: Jerome Toth, Exton, PA (US); Bradley R. Whitney, Epsom, NH (US)

(73) Assignee: Aavid Thermal Corp., Wilmington, DE (US)

( * ) Notice: Subject to any disclaimer, the term of this patent is extended or adjusted under 35 U.S.C. 154(b) by 0 days.

(21) Appl. No.: 17/610,649

(22) PCT Filed: May 15, 2020

(86) PCT No.: PCT/US2020/033197
§ 371 (c)(1),
(2) Date: Nov. 11, 2021

(87) PCT Pub. No.: WO2020/232377
PCT Pub. Date: Nov. 19, 2020

(65) Prior Publication Data
US 2022/0205731 A1    Jun. 30, 2022

Related U.S. Application Data

(60) Provisional application No. 62/848,431, filed on May 15, 2019.

(51) Int. Cl.
| | | |
|---|---|---|
| F28D 15/02 | (2006.01) | |
| F28F 21/02 | (2006.01) | |
| H05K 7/20 | (2006.01) | |

(52) U.S. Cl.
CPC ..... *F28D 15/0233* (2013.01); *F28D 15/0275* (2013.01); *F28F 21/02* (2013.01); *H05K 7/20336* (2013.01); *F28F 2255/02* (2013.01)

(58) Field of Classification Search
CPC .. F28D 15/0233; F28D 15/0275; F28F 21/02; F28F 2255/02; H05K 7/20336
See application file for complete search history.

(56) References Cited

U.S. PATENT DOCUMENTS

| | | | | |
|---|---|---|---|---|
| 5,847,925 A | * | 12/1998 | Progl | G06F 1/203 |
| | | | | 361/679.52 |
| 6,253,836 B1 | * | 7/2001 | Mitchell | F28D 15/0241 |
| | | | | 361/679.55 |

(Continued)

FOREIGN PATENT DOCUMENTS

| | | | | | |
|---|---|---|---|---|---|
| DE | 112019004751 T5 | | 6/2021 | | |
| JP | H10132477 A | * | 5/1998 | ......... | F28D 15/0266 |
| WO | WO-2004029532 A1 | * | 4/2004 | ......... | F28D 15/0266 |

OTHER PUBLICATIONS

Aoyama Junichi, "Flexible Heat Pipe Device", May 22, 1998, Entire Document (Translation of JP H10132477). (Year: 1998).*

(Continued)

*Primary Examiner* — Stephen S Sul
(74) *Attorney, Agent, or Firm* — Michael Best & Friedrich LLP

(57) ABSTRACT

A heat transfer system includes a first vapor chamber, a second vapor chamber spaced from the first vapor chamber, and a flexible thermal strap disposed between and coupled to both the first vapor chamber and the second vapor chamber. The flexible thermal strap permits the second vapor chamber to rotate relative to the first vapor chamber.

28 Claims, 4 Drawing Sheets

(56) References Cited

U.S. PATENT DOCUMENTS

| | | | |
|---|---|---|---|
| 6,356,447 B2 | 3/2002 | Scafidi | |
| 6,367,509 B1* | 4/2002 | Bonneville | F28F 21/02 |
| | | | 138/109 |
| 10,401,926 B1* | 9/2019 | North | G06F 1/1618 |
| 10,959,357 B2* | 3/2021 | Tamayama | H05K 9/0022 |
| 2004/0031593 A1 | 2/2004 | Ernst et al. | |
| 2005/0111189 A1 | 5/2005 | Smalc et al. | |
| 2007/0158050 A1 | 7/2007 | Norley et al. | |
| 2008/0130221 A1* | 6/2008 | Varadarajan | G06F 1/203 |
| | | | 361/679.52 |
| 2008/0196932 A1 | 8/2008 | Sawatari et al. | |
| 2009/0244843 A1* | 10/2009 | Hirohata | F28G 7/00 |
| | | | 361/696 |
| 2014/0362576 A1 | 12/2014 | Degner et al. | |
| 2015/0345872 A1 | 12/2015 | Hoang | |
| 2016/0128227 A1 | 5/2016 | Gernert | |
| 2016/0381781 A1 | 12/2016 | Park | |
| 2017/0192467 A1* | 7/2017 | Holung | E05D 11/10 |
| 2017/0229147 A1* | 8/2017 | McKaskle | G06F 3/0488 |
| 2018/0329464 A1* | 11/2018 | Lin | G06F 1/1681 |
| 2018/0356156 A1 | 12/2018 | Hurbi et al. | |
| 2019/0075683 A1 | 3/2019 | Xu et al. | |
| 2019/0103290 A1 | 4/2019 | Medina et al. | |
| 2019/0354148 A1 | 11/2019 | Delano et al. | |

OTHER PUBLICATIONS

Shimura Takahiro, "Hinge Mechanism, Flow Channel Moving Type Heat Transmission Device, and Flow Channel Moving Type Heat Pipe", Apr. 8, 2004, Furukawa Electric Co. LTD, Entire Document (Translation of WO 2004029532). (Year: 2004).*

International Search Report and Written Opinion for Application No. PCT/US2020/033197 dated Sep. 30, 2020 (14 pages).

International Preliminary Report on Patentability for Application No. PCT/US2020/033197 dated Apr. 15, 2021 (17 pages).

German Patent Office Action for application DE112020002361.3 dated Feb. 24, 2022 (7 pages including statement of relevance).

German Patent Office Action for application DE112020002361.3 dated Dec. 22, 2022 (10 pages including translation).

* cited by examiner

VAPOR CHAMBER THERMAL STRAP ASSEMBLY AND METHOD

CROSS-REFERENCE TO RELATED APPLICATIONS

This application claims priority to U.S. Provisional Application No. 62/848,431, filed May 15, 2019, the entire contents of which are incorporated herein by reference.

BACKGROUND

Many electronic devices, including mobile electronic devices (e.g., smart phones, tablets, etc.), include a display screen that generates significant amounts of light and heat. These devices typically further include large numbers of electronic components and other heat-generating sources all positioned in close proximity to one another and to the display. The electronics components are used to power the display and/or provide other electronic functions for the device. The small size and slight thickness of many of these devices, as well as the number of heat sources and the amount of heat generated, often present challenges for heat transfer and for maintaining the devices at desired operating temperatures.

SUMMARY

In accordance with some embodiments, a heat transfer system includes a first vapor chamber, a second vapor chamber spaced from the first vapor chamber, and a flexible thermal strap disposed between and coupled to both the first vapor chamber and the second vapor chamber. The flexible thermal strap permits the second vapor chamber to rotate relative to the first vapor chamber.

In accordance with other embodiments, a heat transfer system includes a first heat exchanger configured to be fixed to a first portion of a mobile device, a second heat exchanger configured to be fixed to a second portion of the mobile device, and a thermal strap disposed between and coupled to both the first heat exchanger and the second heat exchanger. The thermal strap includes at least one layer of graphite material, and is configured to flex when the mobile device is flexed.

In accordance with still other embodiments, a heat transfer system includes a first vapor chamber having a first frame, a first top cover sheet extending past an end of the first frame, and a first bottom cover sheet extending past the end of the first frame. The heat transfer system further includes a second vapor chamber having a second frame, a second top cover sheet extending past an end of the second frame, and a second bottom cover sheet extending past the end of the second frame. The heat transfer system further includes a thermal strap having a first end coupled to the end of the first frame and a second end coupled to the end of the second frame, wherein the first top cover sheet, the second top cover sheet, the first bottom cover sheet, and the second bottom cover sheet each extend over a portion of the thermal strap.

In accordance with still other embodiments, a heat transfer system includes a first vapor chamber, a first top cover sheet coupled to the first vapor chamber, a second vapor chamber spaced from the first vapor chamber, and a second top cover sheet coupled to the second vapor chamber. The heat transfer system also includes a flexible thermal strap coupled to both the first vapor chamber and the second vapor chamber, and a via extending through the flexible thermal strap and coupled to both the flexible thermal strap and the first top cover sheet.

In accordance with still other embodiments, a heat transfer system includes a core having multiple layers of thermally conductive material, and a thermally conductive via extending through the multiple layers of thermally conductive material.

Other embodiments and aspects of various embodiments will become apparent by consideration of the detailed description and accompanying drawings.

DETAILED DESCRIPTION

Before any embodiments are explained in detail, it is to be understood that the embodiments disclosed herein are not limited in their application to the details of construction and the arrangement of components set forth in the following description or illustrated in the accompanying drawings. Other embodiments are possible, and embodiments described and illustrated herein are capable of being practiced or of being carried out in various ways. Also, it is to be understood that the phraseology and terminology used herein is for the purpose of description, and should not be regarded as limiting. The use of "including," "comprising" or "having" and variations thereof herein is meant to encompass the items listed thereafter and equivalents thereof as well as additional items. The terms "mounted," "connected" and "coupled" are used broadly, and encompass both direct and indirect mounting, connecting and coupling. Further, "connected" and "coupled" are not restricted to physical or mechanical connections or couplings, and can include electrical connections or couplings, whether direct or indirect.

Figure 1:
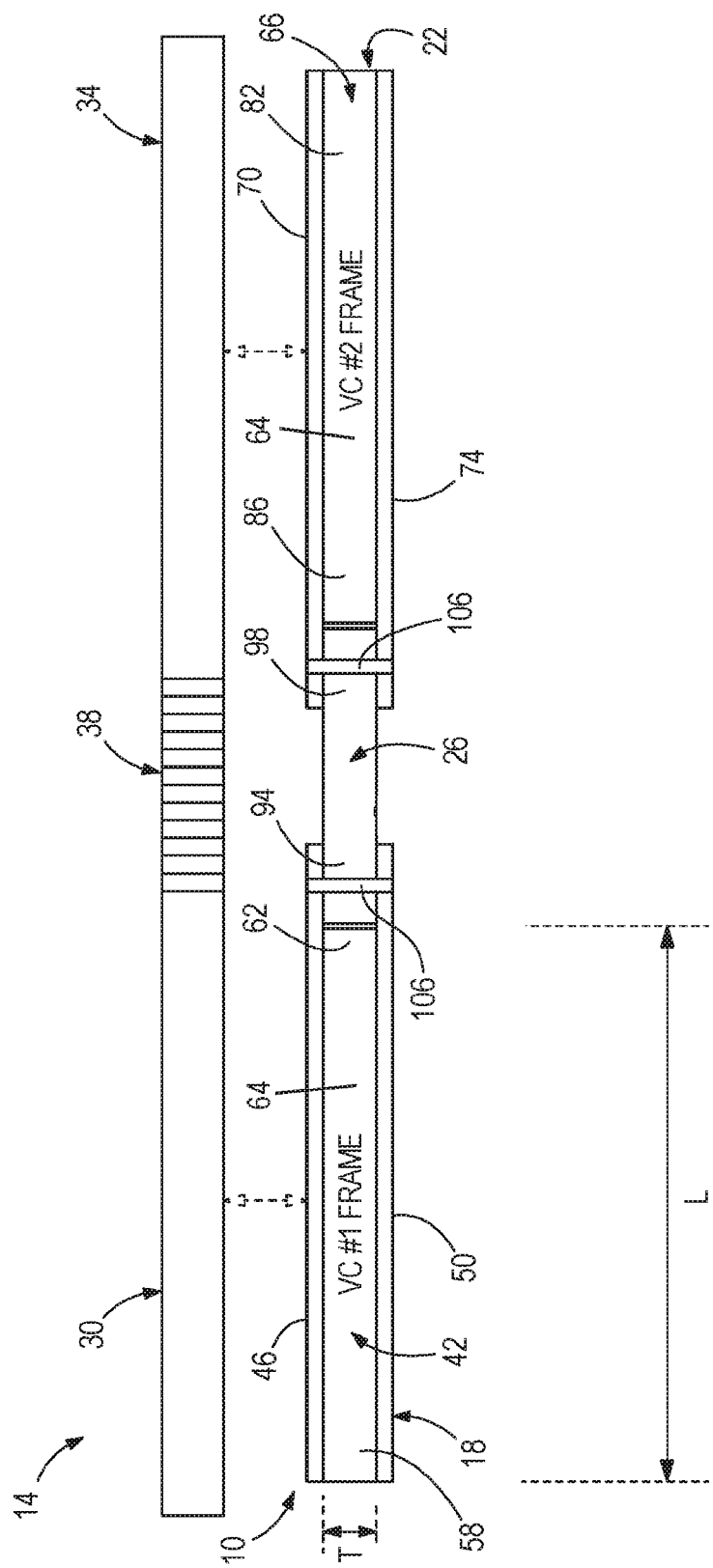
FIG. 1 is a schematic, cross-sectional side view of a heat transfer system according to one embodiment.
Figure 2:
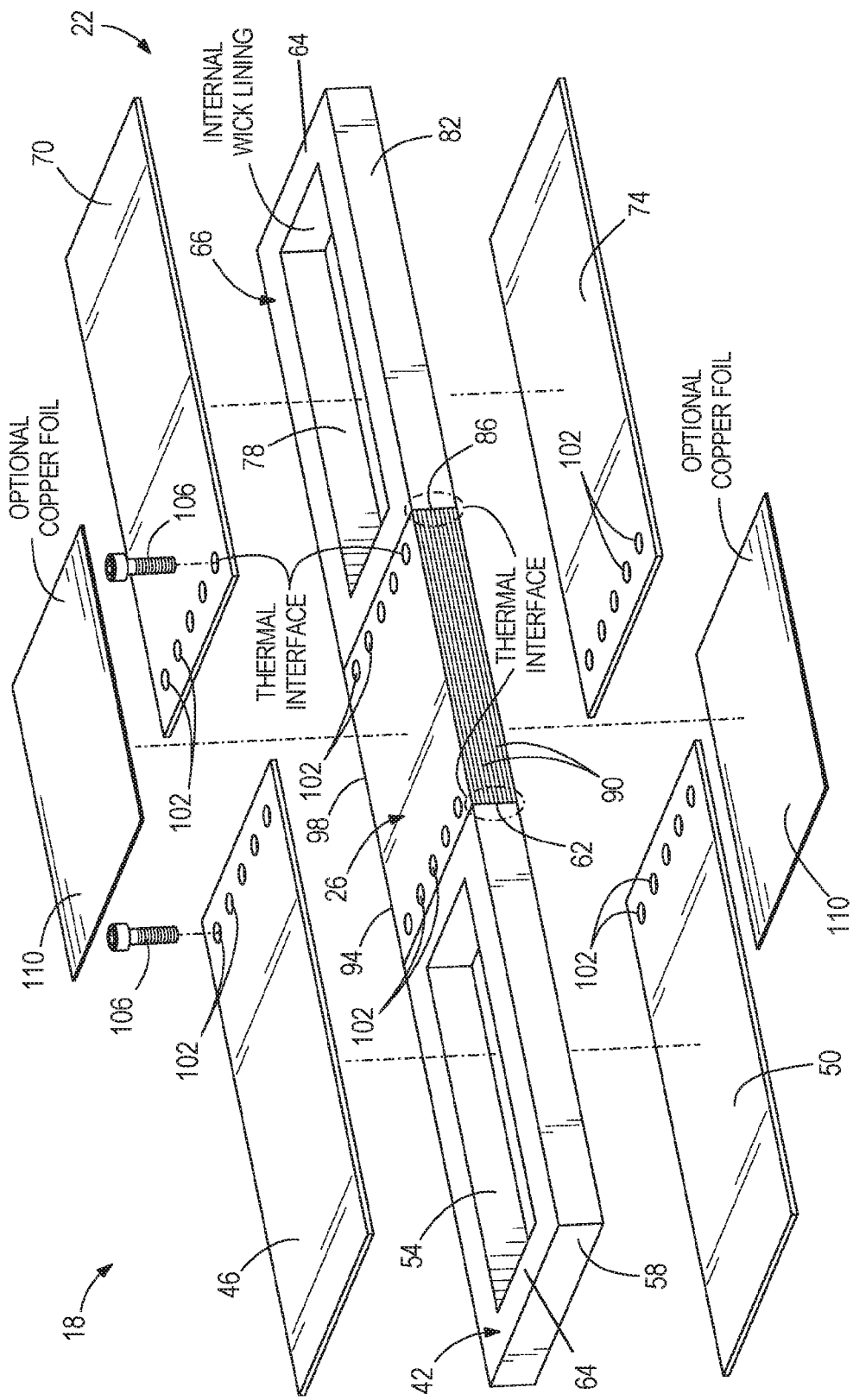
FIG. 2 is a schematic, exploded view of the heat transfer system of FIG. 1.
Figure 3:
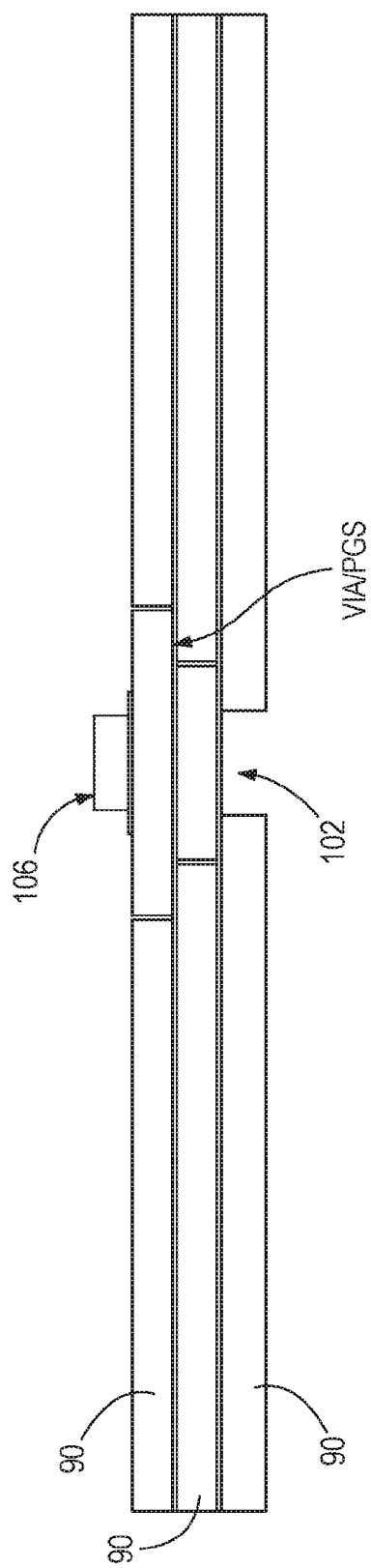
FIG. 3 is a schematic, cross-sectional side view of a portion of the heat transfer system of FIG. 1.

FIGS. 1-3 illustrate a heat transfer system 10 for use with a mobile or portable device 14 (the terms "portable" and "mobile" being used herein interchangeably), such as a mobile phone or tablet, by way of example only. As illustrated in FIGS. 1 and 2, the heat transfer system 10 includes a first vapor chamber 18, a second vapor chamber 22 spaced from the first vapor chamber 18 in the arrangement of elements shown in FIGS. 1-3, and a flexible thermal strap 26 coupled to the first vapor chamber 18 and the second vapor chamber 22. In the arrangement of elements shown in FIGS. 1-3, the flexible thermal strap 26 is disposed between the first and second vapor chambers 18, 22. The flexible thermal strap 26 allows for rotational or pivoting movement of the first vapor chamber 18 relative to the second vapor chamber 22 and vice versa.

In some embodiments, the second vapor chamber 22 may be rotated at least 30 degrees, at least 60 degrees, at least 90 degrees, at least 120 degrees, or at least 150 degrees relative to the first vapor chamber 18. In yet other embodiments, the second vapor chamber 22 may be rotated at least 180 degrees relative to the first vapor chamber 18. In some embodiments, the second vapor chamber 22 may be rotated nearly 360 degrees (e.g., up to 300, 320, or 340 degrees). In some embodiments, the second vapor chamber 22 may be rotated no farther than 30 degrees, 60 degrees, 90 degrees, 120 degrees, 150 degrees, or 180 degrees relative to the first vapor chamber 18. Other embodiments can include different values and ranges of rotation.

In some embodiments, the second vapor chamber 22 may be rotated (e.g., in a clockwise direction or a counterclockwise direction as viewed in FIG. 1) until the second vapor chamber 22 lies over and/or is in a stacked orientation and position with respect to the first vapor chamber 22. In such embodiments, parts of the portable device 14 can still separate the first and second vapor chambers 18, 22 in such a folded or stacked orientation and position, such as a case, a display screen, or other part of the portable device 14, whereas in other embodiments, the first and second vapor chambers 18, 22 may even come into contact with one another in such an orientation and position.

By way of example only, when the first and second vapor chambers 18, 22 of the illustrated embodiment are in their folded and stacked position and orientation, the first and second vapor chambers 18, 22 are in close proximity to one another, but may for example be separated from one another by at least a case of the mobile device 14. The case may at least partially enclose the first and second vapor chambers 18, 22, as well as a battery, transmitter, receiver, speaker, and/or microphone. Although the flexible thermal strap 26 illustrated in FIGS. 1-3 is adapted to flex so that the second vapor chamber 22 rotates counterclockwise (in FIGS. 1 and 2) to overlie the first vapor chamber 18, in other embodiments the flexible thermal strap 26 is instead or also adapted to flex so that the second vapor chamber 22 can also or instead rotate in a clockwise direction (again with reference to FIGS. 1 and 2) to underlie the first vapor chamber 18. In some embodiments, the flexible thermal strap 26 may be flexible enough to permit rotation of the second vapor chamber 22 from a neutral position (seen in FIGS. 1 and 2) to a first rotational position where the second vapor chamber 22 has been rotated counterclockwise (e.g., 160 degrees) such that the second vapor chamber 22 is disposed above the first vapor chamber 18. The flexible thermal strap 26 may also, or alternatively, be flexible enough to permit rotation of the second vapor chamber 22 from the neutral position (seen in FIGS. 1 and 2) to a second rotational position where the second vapor chamber 22 has been rotated clockwise (e.g., 160 degrees) such that the second vapor chamber 22 is disposed below the first vapor chamber 18. As illustrated in FIGS. 1 and 2, in some embodiments the neutral position defines a position in which the first vapor chamber 18, the second vapor chamber 22, and the flexible thermal strap 26 are all aligned (e.g., along a common axis, or common plane). In the illustrated embodiment, the flexible thermal strap 26 has a generally straight profile in this neutral position. However, in other embodiments the neutral position may be one in which the flexible thermal strap 26 is at least partially bent, folded, or otherwise not in a straight profile, but is still flexible enough to permit the types of rotations described above. Additionally, while the first vapor chamber 18 and the second vapor chamber 22 are aligned in the illustrated embodiment in the neutral position, in other embodiments the second vapor chamber 22 may be inclined at an angle (e.g., at 10 degrees, 20 degrees, 30 degrees, etc.) relative to the second vapor chamber in the neutral position. The neutral position may correspond, for example, to an in-use state of the mobile device 14, such as when the mobile device 14 is being held to a user's ear, is being viewed by a user, or is otherwise being used. Alternatively, the neutral position may correspond to a non-use position of the mobile device 14 in which the mobile device 14 is not in use, such as when a case or cover is covering the mobile device 14, or in when the mobile device 14 is being stored in a pocket.

The mobile device 14 is shown in an exploded schematic form in FIG. 1, with the heat transfer system 10 being removed from the rest of the mobile device 14. In some embodiments, at least part of (or all of) the heat transfer system 10 is enclosed within the mobile device 14. For example, the mobile device 14 illustrated in FIG. 1 includes a case, and a battery, antenna, receiver, transmitter, microphone, and speaker (not shown), as is common in many mobile electronic devices. The battery may be coupled to and adapted to supply power to the display, the transmitter, the receiver, the speaker, and the microphone. The heat transfer system 10 illustrated in FIG. 1 can be located, for example, at least partially within the case of the mobile device 14. In other embodiments, any part of all of the heat transfer system 10 can be located outside of (e.g., defining an exterior surface of, and/or positioned immediately adjacent) the mobile device 14. Other embodiments include other types of mobile devices than that illustrated. For example, in some embodiments the mobile device 14 does not include a microphone, or includes features not found in the illustrated mobile device 14.

As illustrated in FIG. 1, the mobile device 14 includes a first region 30, a second region 34, and a flexible region 38 disposed between the first region 30 and the second region 34. The first region 30, the second region 34, and/or the flexible region 38 may define at least part of the case, or another portion of the mobile device 14. The flexible region 38 allows for rotational or pivoting movement of the first region 30 relative to the second region 34. For example, in some embodiments the second region 34 may be rotated approximately 180 degrees in either a clockwise or counterclockwise direction as viewed in FIG. 1, until the second region 34 is abutting or otherwise in contact with the first region 30, or is in close proximity to the first region 30. In yet other embodiments, the second region 34 is able to rotate up to approximately 90 degrees from the position illustrated in FIG. 1 (i.e., to an upward vertical orientation or downward vertical orientation in the orientation of FIGS. 1 and 2). In some embodiments, the first region 30 and the second region 34 are also flexible regions (i.e., have some amount of flexibility or the same flexibility as that of the flexible region 38), such that the entire mobile device 14 is flexible and may be flexed into different shapes. In some embodiments, the first region 30 and/or the second region 34 are rigid, and are not intended to be flexed. Other embodiments include different numbers and locations of flexible regions, as well as different relative sizes and lengths of flexible regions than that illustrated.

At least one of the first region 30, the second region 34, and the flexible region 38 may include a display (e.g., a digital display such as that commonly found on a smart phone, tablet, or other portable electronic device). In some embodiments, only the first region 30 and the second region 34 include a display, whereas the flexible region 38 does not include a display (thus forming a device with two separate displays). In the illustrated embodiment, the display may face, for example, away from the first and second vapor chambers 18, 22. In some embodiments, only the flexible region 38 includes a display. The first region 30, the second region 34, and/or the flexible region 38 may each include a display or share different portions of the same display. The display(s) of the first region 30, the second region 34, and the flexible region 38 may form a single, overall display region for the mobile device 14. Thus, one or more portions of the display region (e.g., the portion at the flexible region 38) of the mobile device 14 may be bent and/or flexed, such that a portion of the display is directed at a user, whereas another portion of the display is folded away from the user. The portion of the display that is actually bending, or folding, may include (for example) one or more areas of reduced thickness, or cutouts to improve bending capabilities, or may be made of material (e.g., a polymeric material) that is sufficiently thin and/or made of a material flexible enough to permit the bending or folding. In some embodiments, the display formed by one or more of the first region 30, the second region 34, and the flexible region 38 is an interactive display, and may include for example a touchscreen or other interactive feature that allows a user to physically touch the display to interact with the mobile device 14.

With continued reference to FIG. 1, in the illustrated embodiment the first vapor chamber 18 is coupled (e.g., fixed with fasteners or adhesive) to the first region 30, and the second vapor chamber 22 is coupled (e.g., fixed with fasteners or adhesive) to the second region 34, such that when the mobile device 14 is flexed or bent at the flexible region 38, the flexible thermal strap 26 facilitates a corresponding flexing and rotation of the second vapor chamber 22 relative to the first vapor chamber 18, and vice versa. In some embodiments, the first vapor chamber 18 is not fixed, but rather is releasably coupled (e.g., via snap-fit, interference fit, etc.) to the first region 30. Similarly, the second vapor chamber 22 may be releasably coupled (e.g., via snap-fit, interference fit, etc.) to the second region 34. Such a releasable coupling connection may allow for replacement and/or repair of the vapor chambers 18, 20 if needed, as well as the flexible thermal strap 26.

With reference to FIGS. 1 and 2, in the illustrated embodiment the first vapor chamber 18 includes a frame 42 (e.g., made of copper, aluminum, stainless steel, titanium or other suitable material). A top cover sheet 46 is positioned on top of the frame 42, and a bottom cover sheet 50 is positioned below the frame 42 in the illustrated embodiment. The top and bottom cover sheets 46, 50 can be made of the same or different material as the frame 42 (e.g., copper, aluminum, stainless steel, titanium or other suitable material). In some embodiments, one or more of the top cover sheet 46 and the bottom cover sheet 50 is positioned, for example, adjacent and/or in thermal communication with a display, a circuit element, another electronics component of the mobile device 14, or any other heat source. For example, in the illustrated embodiment of FIGS. 1 and 2, the top cover sheet 46 is positioned adjacent the first region 30, which may include a display that generates heat. In some embodiments, the bottom cover sheet 50 is also, or alternatively, disposed adjacent another heat source (e.g., from a circuit element inside a portion of the mobile device 14 that may be below the bottom cover sheet 50). In yet other embodiments, the bottom cover sheet 50 may be exposed, for example, outside of the mobile device 14 and face away from the mobile device 14. The bottom cover sheet 50 (or the top cover sheet 46) may serve as a condenser region, as described further herein, for releasing heat away from the mobile device 14.

In the illustrated embodiment, the frame 42, the top cover sheet 46, and the bottom cover sheet 50 together define an interior space 54 (FIG. 2). The frame 42 of the illustrated embodiment of FIGS. 1 and 2 has a generally rectangular shape as viewed from the side in FIGS. 1 and 2, but may have other shapes than that illustrated. For example, in some embodiments the frame 42 may have a square shape, an oval shape, a circular shape, etc. as viewed from the side or from above. Additionally, the frame 42 of the illustrated embodiment (and/or, for example, the volume that defines the interior space 54 defined by the frame) also has a rectangular cross-sectional shape. In other embodiments, the frame 42 (and/or the volume defining the interior space 54) may have a circular, oval, or other cross-sectional shape.

With continued reference to FIGS. 1 and 2, in the illustrated embodiment the frame 42 of the vapor chamber 18 includes a first end 58 and a second, opposite end 62 that each extend (e.g., vertically) between the top cover sheet 46 and the bottom cover sheet 50. In the illustrated embodiment, the top cover sheet 46 and the bottom cover sheet 50 each extend laterally (e.g., horizontally) beyond the second end 62 of the frame 42 (i.e., in a direction toward the second vapor chamber 22). In other embodiments, only one of the top cover sheet 46 and the bottom cover sheet 50 extend laterally (e.g., horizontally) beyond the second end 62 of the frame 42 (i.e., in a direction toward the second vapor chamber 22). As described above, the frame 42 has a generally rectangular shape. Thus, the first end 58 and the second end 62 extend vertically and define a thickness T of the frame 42 along the vertical direction seen in FIG. 1. In the illustrated embodiment, this thickness is significantly less than a length L (e.g., horizontal length as seen in FIG. 1) of the frame 42. For example, in some embodiments the frame 42 has length L that is at least twice as large, or three times as large, as the thickness T. Other embodiments include different ratios or values.

In some embodiments, the first vapor chamber 18 (and/or the second vapor chamber 22) is or defines at least one heat pipe 64 with a working fluid therein. The heat pipe 64 may be elongated and tubular, for example, and/or may be straight or with one or more bends or curves. The heat pipe 64 may be sized and shaped to transfer and/or spread thermal energy generated by at least one heat source (e.g., from the first region 30 or the second region 34 of the mobile device 14). The heat pipe 64 may include a first end and a second, opposite end, and may include an evaporator region or regions (e.g., at the first end, or at regions along the heat pipe 64 that are exposed to heat from the first region 30 of the mobile device 14), and may also include a condenser region (e.g., at the second end or at other locations along the heat pipe 64). The heat pipe 64 may take a variety of shapes and forms. For example, in some embodiments the heat pipe 64 may be a single elongate axial tube. In other embodiments, the heat pipe 64 may include at least one curve or bend. In some embodiments, the heat pipe 64 is a loop heat pipe 64, or a thermosiphon, or is a variable conductance heat pipe 64. Alternatively or in addition, the heat pipe 64 can have a substantially flat and rectangular profile similar to the first vapor chamber 18 seen in FIGS. 1 and 2 (e.g., having length and width dimensions that are substantially larger than the thickness of the heat pipe 64), in which case the evaporator and condenser regions of the heat pipe 64 can be defined by opposite substantially flat sides of the heat pipe 64. Other embodiments include various heat pipe 64 shapes and sizes other than that illustrated.

In the illustrated embodiment, the vapor chambers 18, 22 function as heat pipes 64, and as heat exchangers. Thus, a working fluid (e.g. water, ammonia, Freon®, acetone, ethane, ethanol, heptane, methanol, hydrocarbons, fluorocarbons, methyl chloride, NaK, carbon dioxide, methylamine, pentane, propylene, methane, oxygen, neon, hydrogen, liquid metals such as cesium, potassium, sodium, lead, lithium, mercury, rubidium, and silver, cryogenic fluids such as helium and nitrogen, and other fabricated or naturally-occurring working fluids) may be disposed within the interior spaces 54, 78 of the first and second vapor chambers 18, 22, and may be used to collect the heat at evaporator regions (e.g., on one side of the vapor chamber 18, 22, such as on the top cover sheets 46, 70 or on the bottom cover sheets 50, 74), and to move the heat to a condenser region (e.g., on an opposite side of the vapor chamber 18, 22, such as on the bottom cover sheets 50, 74 or on the top cover sheets 46, 70). In general, a vapor chamber can conduct heat from a heat source, such as from an electronic device, through vapor heat transfer. The vapor chambers 18, 22 thus each include a working fluid, an evaporator region, and a condenser region. The working fluid is vaporized at the evaporator region. The vapor is received at the condenser region, whereupon the vapor is condensed (releasing heat) to form a liquid working fluid. The condensed working fluid then returns to the evaporator region, such as by gravity-induced flow and/or by capillary action through a wick structure, thereby completing a working fluid cycle. The first vapor chamber 18 includes the working fluid, and in some embodiments at least one layer of wick material covering some or all of an inside surface of the frame 42, the top cover sheet 46, and/or the bottom cover sheet 50. Any suitable wick material can be used as desired, such as a sintered metal capillary wick (e.g., sintered copper powder), a mesh material, and the like.

In some embodiments, and as described above, the top cover sheet 46, being positioned adjacent a display of the mobile device 14, may define at least part of the evaporation region that receives heat. The bottom cover sheet 50, the first end 58, and/or the second end 62 may define at least part of the condenser region. In other embodiments, the bottom cover sheet 50, being positioned for example adjacent an electronics component of the mobile device 14, may define at least part of the evaporator region that receives heat, and the top cover sheet 46, the first end 58, and/or the second end 62 may define at least part of the condenser region. In yet other embodiments, the first end 58 or the second end 62 may be define at least part of the evaporator region. The evaporator regions or condenser regions may thus change, depending for example upon what electronic components are heated at any given time, or whether an influx of heat is being provided for example through the flexible thermal strap 26 itself. Additionally, and in some embodiments, the vapor chambers 18, 22 may include more than one evaporator region and/or more than one condenser region, depending on the location(s) and number of heat sources that are in thermal communication with the vapor chambers 18, 22.

With continued reference to FIGS. 1 and 2, the second vapor chamber 22 is similar in structure and operation to the first vapor chamber 18, and thus includes a frame 66, a top cover sheet 70 positioned on top of the frame 66, and a bottom cover sheet 74 positioned below the frame 66. The frame 66, the top cover sheet 70, and the bottom cover sheet 74 together define an interior space 78 (FIG. 2). As illustrated in FIG. 2, the frame 66 has a generally rectangular shape similar to the frame 42, but may have other shapes than that illustrated. The frame 66 includes a first end 82 and a second, opposite end 86 that each extend between the top cover sheet 70 and the bottom cover sheet 74. Similar to the first vapor chamber 18, the second vapor chamber 22 is a heat exchanger, and functions as a heat pipe 64. Thus, the second vapor chamber 22 includes a working fluid, and receives heat from at least one heat source (e.g., an electronics component in the mobile device, and/or the thermal strap 26 as described in more detail below) at an evaporator region or regions of the second vapor chamber 22 (e.g., the top cover sheet 70, the bottom cover sheet 74, the first end 82, and/or the second end 86), and moves the heat away from the heat source or sources to a condenser region or regions of the second vapor chamber 22.

As illustrated in FIGS. 1 and 2, the flexible thermal strap 26 includes one or more flexible layers (e.g., stacked sheets) of core material 90. In the illustrated embodiment, some or all of the flexible layers are made of or include sheets of graphite material (e.g., natural graphite material, synthetic graphite material such as pyrolytic or annealed pyrolytic graphite, k-Core® graphite material, and the like), copper, aluminum, thermally-conductive plastic, or other flexible heat-conductive material that conducts heat from the second end 62 of the first vapor chamber 18 to the second end 86 of the second vapor chamber 22, or from the second end 86 of the second vapor chamber 22 to the second end 62 of the first vapor chamber 18. In some embodiments, the layers of the core material 90 are thin layers that are joined together by, for example, electron beam welding or resistance welding, or with a bonding agent. The layers may have high in-plane conductivity (e.g., between 1000 W/mK and 1700 W/mK), but in some embodiments have generally poor thru-thickness conductivity values (e.g., approximately 6 W/mK). Other embodiments include different ranges and values for thermal conductivity based at least in part upon the material of the sheets making up the flexible thermal strap 26.

In the illustrated embodiment of FIGS. 1-3, the flexible thermal strap 26 includes a first mounting end 94 that is in abutment or in other contact with, or in close proximity to, the second end 62 of the first vapor chamber 18, and a second mounting end 98 that is in abutment or in other contact with, or in close proximity to, the second end 86 of the second vapor chamber 22. The flexible thermal strap 26 is in thermal communication with both the first vapor chamber 18 and the second vapor chamber 22 by the connections of the first and second mounting ends 94, 98 to the first and second vapor chambers 18, 22. The length of the flexible thermal strap 26 (along a direction extending between the first vapor chamber 18 and the second vapor chamber 22) may be chosen to provide a minimum desired rotation for the second vapor chamber 22 relative to the first vapor chamber 18 (e.g., 90 degrees, 180 degrees). In some embodiments, for example, the length may be less than 2 inches, less than 1 inch, less than 0.5 inch, less than 0.25 inch, etc. The thickness of the flexible thermal strap 26 (i.e., along a direction perpendicular to the length, and generally along a vertical direction as viewed in FIG. 1) may also be chosen so that the thickness of the flexible thermal strap 26 is less than or equal to a thickness of the first and second vapor chambers 18, 22. For example, the thickness may be less than 0.5 inch, less than 0.25 inch, less than 0.1 inch, etc. In the illustrated embodiment of FIGS. 1-3, the thickness of the flexible thermal strap 26 is selected to be the same as the thickness T of the frames 42, 66 of the vapor chambers 18, 22. In yet other embodiments, the thickness of the flexible thermal strap 26 may be greater than the thickness T of the frames 42, 46, so long as the flexible thermal strap 26 still retains some flexibility. Additionally, in some embodiments the flexible thermal strap 26 may include notches, perforations, cutouts, or other areas where material has been removed to increase the flexibility of the flexible thermal strap 26, and/or may include one or more areas that are made of one material and other areas made of a different material that provides increased flexibility to one or more areas of the flexible thermal strap 26.

As shown in FIG. 2, the illustrated flexible thermal strap 26 additionally includes mounting apertures 102 at both the first mounting end 94 and the second mounting end 98. The mounting apertures 102 of the illustrated embodiment extend through each of the layers of the core material 90. Also in the illustrated embodiment, the top cover sheets 46 and 70 as well as the bottom cover sheets 50 and 74 additionally include mounting apertures 102. As illustrated in FIGS. 1 and 2, the top cover sheets 46, 70, as well as the bottom cover sheets 50, 74, each extend past the respective second ends 62, 86 of the frames 42 and 66 (e.g., as overhangs), such that the mounting apertures 102 of the top cover sheets 46, 70 and the bottom cover sheets 50, 74 align with the mounting apertures 102 in the flexible thermal strap 26. In this manner, the core material 90 (e.g., graphite) tucks into or is sandwiched in the space defined between the overhanging top cover sheets 46, 70 and bottom cover sheets 50, 74. Other embodiments include different numbers and arrangements of mounting apertures 102 than that illustrated. Additionally, in some embodiments the flexible thermal strap 26 may not include any mounting apertures 102. For example, the layers of core material 90 and/or the top and bottom cover sheets 46, 50, 70, 74 may be adhered or otherwise fastened together in other manners.

In the illustrated embodiment, and during assembly of the heat transfer system 10, vias 106 (e.g., pins or pegs) are inserted into the mounting apertures 102 of the top cover sheets 46, 70, the bottom cover sheets 50, 74, and/or the layers of the core material 90 of the flexible thermal strap 26. Once the vias 106 have been inserted into the mounting apertures 102, the vias 106 may be compressed down until the top cover sheets 46, 70, the bottom cover sheets 50, 74, and the constituent layers of core material 90 are securely held in place by the vias 106.

The mounting apertures 102 and the vias 106 may take any of a number of shapes and forms. For example, the mounting apertures 102 may each be of an identical size, and the vias 106 may each be a single piece having a constant or varying diameter along the length thereof. When the vias 106 are initially inserted into the mounting apertures 102, the vias 106 may extend partially outside of the mounting apertures 102 at one or both ends. The vias 106 may then be compressed, such that the vias 106 are deformed and expand within the mounting apertures 102 to fill the mounting apertures 102 and to form a secure interference fit to fix the vias 106 in place. In some embodiments, compressing the vias 106 will form enlarged heads on the vias 106 at one or both ends to fix the vias 106 in the mounting apertures 102. In some embodiments, after being secured in place within the mounting apertures 102, either or both ends of the vias 106 are flush with or recessed within the adjacent exterior surfaces of the flexible thermal strap 26, or the top and/or bottom cover sheets 46, 70, 50, 74.

In yet other embodiments, and as illustrated in FIG. 3, the mounting apertures 102 may have different shapes (e.g., different diameters) in different layers of the core material 90. Each via 106 additionally may be formed from multiple pieces (e.g., having a thickness of the layer of core material 90) positioned on top of one another, or from multiple portions of the same via 106 having different cross-sectional shapes and/or sizes along the length of the via 106. When compressed down during assembly, the individual pieces can fill in mounting aperture 102 to form a secure interference fit to fix the via 106 in place. Once assembled, and as indicated above, the vias 106 may have vertical heights that are equal to a height of the flexible thermal strap 26 or that are equal to the combined thickness of the flexible thermal strap 26 and the top and/or bottom cover sheets 46, 70, 50, 74, such that the vias 106 are generally flush with upper and lower surfaces of the flexible thermal strap 26 or the top and/or bottom cover sheets 46, 70, 50, 74, respectively.

The vias 106 act as conductive columns within the flexible thermal strap 26, to transfer heat vertically through the layers of core material 90. In the illustrated embodiment, five vias 106 are used at each of the first mounting end 94 and the second mounting end 98, although other embodiments include different numbers and arrangements of vias 106 than that illustrated. In some embodiments, the vias 106 are made of isotropic metal such as copper or aluminum, although other embodiments include different materials. The vias 106 may provide, for example, a thermal conductivity that is greater than 50 W/mK, although other embodiments include vias 106 having different thermal conductivity values and ranges. The vias 106 may also be in direct contact with the top cover sheets 46, 70 and/or the bottom cover sheets 50, 74, and may be in direct contact with the surrounding graphite or other material of the layers of core material 90 (e.g., allowing the graphite's high in-plane conductance to move and spread heat efficiently).

Use of the vias 106 additionally enhances the ability of the flexible thermal strap 26 to efficiently conduct heat across the flexible thermal strap 26 not only horizontally (i.e., in-plane along the layer or layers forming the core material 90 as described above), but also vertically, or in any oblique direction relative to the layers of core material 90. For example, in some embodiments the flexible thermal strap 26 may be physically in contact with or located proximate a heat source (e.g., from the mobile device 14) directly above the flexible thermal strap 26 or directly below the flexible thermal strap 26. Heat may therefore enter the flexible thermal strap 26 not only from the second end 62 or the second end 86, but also or alternatively from above the flexible thermal strap 26 or below the flexible thermal strap 26. The vias 106 facilitate quick movement of heat vertically (as viewed in FIG. 1) down into (or up into) the layers of graphite or other material forming the core material 90 of the flexible thermal strap 26, so that heat may travel in more than one direction within the flexible thermal strap 26 from an area of higher heat to an area of lower heat.

With reference to FIG. 2, in some embodiments the heat transfer system 10 additionally includes a coating material 110 that encapsulates the layers of core material 90 of the flexible thermal strap 26. The coating material 110 may be a copper foil skin or skins that partially or entirely encapsulates and seals the layers of the core material 90. The coating material 110 may extend partially or entirely around the flexible thermal strap 26, as well as over the vias 106, and under the overhangs of the top cover sheets 46, 70 and the bottom cover sheets 50, 74. The coating material 110 may be applied, for example, by metal plating, painting, coating, or deposition processes. Other embodiments include different materials for the coating material 110.

Figure 4A:
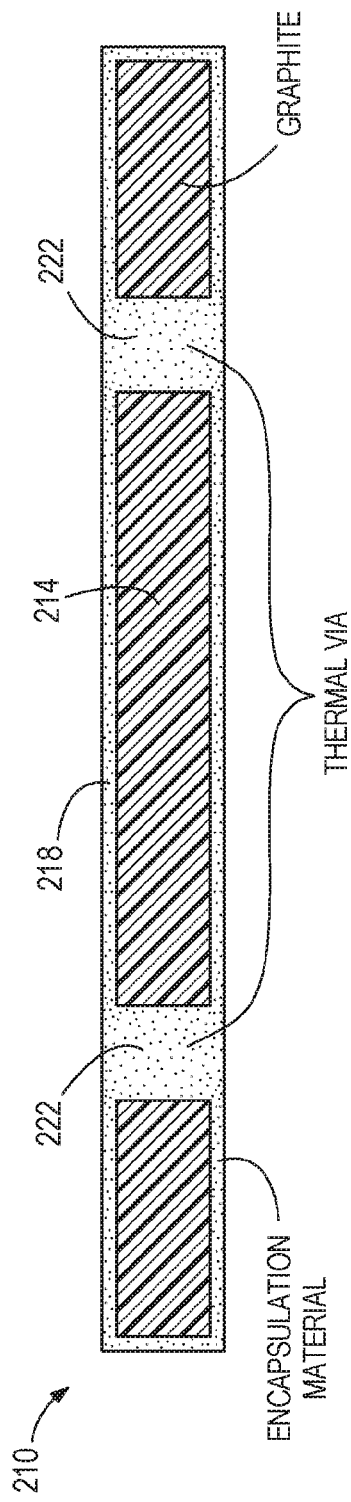
FIG. 4A is a schematic, cross-sectional side view of a heat transfer system according to another embodiment.
Figure 4B:
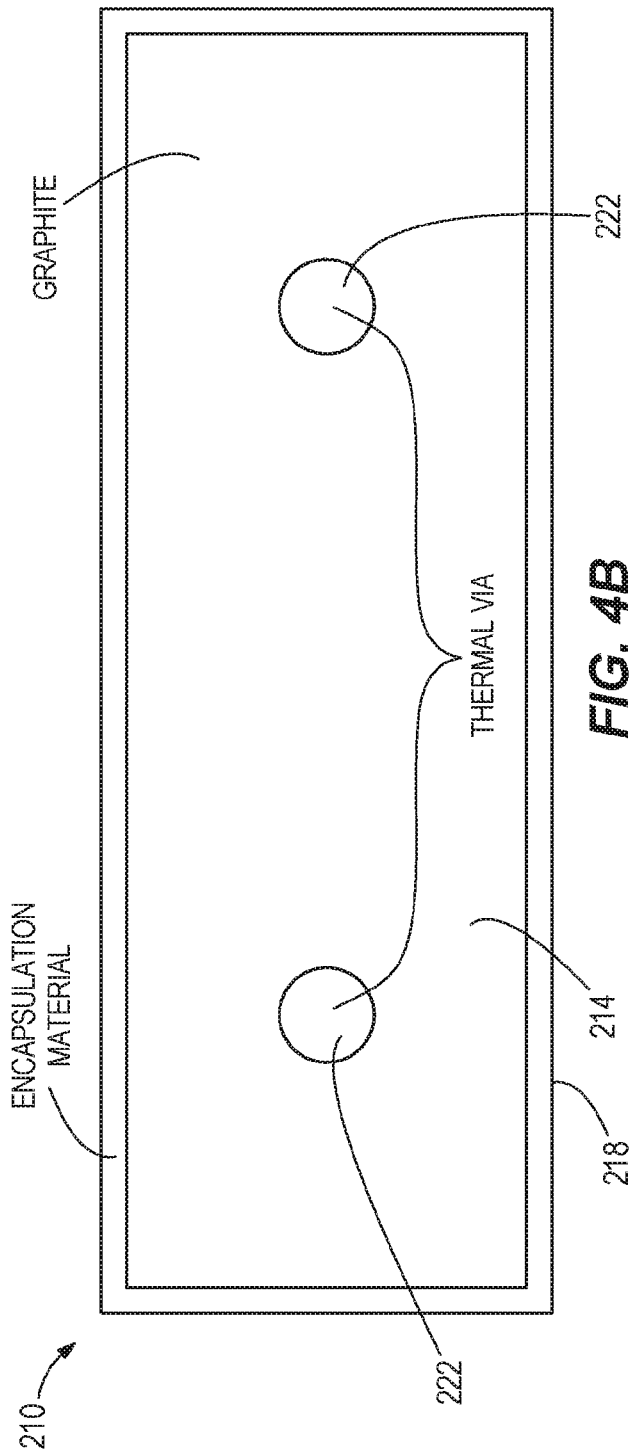
FIG. 4B is a schematic, cross-sectional top view of the heat transfer system of FIG. 4A.

FIGS. 4A and 4B illustrate another embodiment of a heat transfer device 210 that may also be used as a thermal strap to connect the first vapor chamber 18 to the second vapor chamber 22 in the mobile device 14, or may be used to connect other structures or otherwise dissipate heat within a generally thin, mobile device 14. The heat transfer device 210 includes a single, thick layer of a highly conductive core material 214. The core material 214 may be flexible, similar to the core material 90. In the illustrated embodiment by way of example only, the core material 214 is annealed pyrolytic graphite (APG). Annealed pyrolytic graphite (APG) materials can be fabricated in thick sections depending on how long the material is exposed to a carbon deposition process. The heat transfer device 210 therefore includes just a single layer of the APG material which may be processed down to a desired thickness.

As illustrated in FIGS. 4A and 4B, the single layer of core material 214 is coated or encapsulated within a thin metal or organic coating material 218, such as a material similar to the coating material 110 described above. The coating material 218 can serve as an exterior layer, sealing the graphite layer of core material 214, preventing shredding of the graphite, and/or providing a clean robust mounting surface to allow the resulting heat transfer device 210 to be attached to another component (e.g. to the first vapor chamber 18, the second vapor chamber 22, or another structure).

Similar to the flexible thermal strap 26 described above, the heat transfer device 210 also includes at least one conductive thermal via 222 (e.g., conductive column) within the heat transfer device 210, to transfer heat vertically through the layer of graphite. In the illustrated embodiment two vias 222 are illustrated, although other embodiments include different numbers of vias 222. Similar to the vias 106, the vias 222 may be made of isotropic metal such as copper or aluminum, although other embodiments include different materials.

The vias 222, as well as the vias 106, may extend vertically as illustrated, or may extend at other angles. For example, in some embodiments, the flexible thermal strap 26 and/or the heat transfer device 210 described above may include vias 106, 222 that extend horizontally, or at oblique angles, relative to the layers of core material 90, 214, or the coating materials 110, 218. The vias 106, 222 may serve not only as mechanisms by which to secure layers of conductive material together (and to secure those layers with outside layers of coating or other material), but also to facilitate heat transfer. For example, in some embodiments the vias 106, 222 may be made of a conductive material that conducts heat faster than the surrounding material (e.g., the core material 90, 214). Additionally, while the vias 106, 222 may be generally elongate (e.g., cylindrical) elements once formed or installed, in other embodiments the vias 106, 222 may take on other shapes and sizes than that illustrated. For example, the vias 106, 222 may have shapes with changing cross-sections along an elongated dimension or any other dimension, and shapes that are larger at one region of the flexible thermal strap 26 or heat transfer device 210 than at another region.

While the layers of core material 90, 214 and the vias 106, 222 are described above in the context of use with a mobile device and with for example a flexible thermal strap for a mobile device, in other embodiments the layers of core material 90, 214 and/or the vias 106, 222 may be used in other contexts and with other devices (including non-flexible devices or portions of devices). Thus, in some embodiments a heat transfer system may generally include a core having multiple layers of thermally conductive material (e.g., one or layers of the core material 90, 214, such as sheets of graphite material), and at least one thermally conductive via (e.g., one or more of the vias 106, 222, such as a pin or peg) extending through the multiple layers of thermally conductive material. In some embodiments, the layers of core material 90, 214 and/or the vias 106, 222 may also be encapsulated with a coating material (e.g., coating material 110 or 218).

Although various embodiments have been described in detail with reference to certain examples illustrated in the drawings, variations and modifications exist within the scope and spirit of one or more independent aspects described and illustrated.

What is claimed is:

1. A heat transfer system comprising:
   a first vapor chamber;
   a second vapor chamber spaced from the first vapor chamber; and
   a flexible thermal strap, wherein the flexible thermal strap defines an axis and has a first axial end and a second opposite axial end, wherein the flexible thermal strap is coupled to both the first vapor chamber and the second vapor chamber, wherein the first axial end of the flexible thermal strap faces an end of the first vapor chamber along the axis and the second axial end of the flexible thermal strap such that the flexible thermal strap is coplanar with the first vapor chamber and the second vapor chamber, and wherein the flexible thermal strap includes planar layers of thermally conductive material, and
   wherein the flexible thermal strap is configured to permit the second vapor chamber to rotate relative to the first vapor chamber.

2. The heat transfer system of claim 1, wherein the flexible thermal strap is disposed between the first vapor chamber and the second vapor chamber in at least one rotational position of the first vapor chamber with respect to the second vapor chamber.

3. The heat transfer system of claim 1, wherein the flexible thermal strap is attached at the first axial end to the first vapor chamber and at the second axial end to the second vapor chamber.

4. The heat transfer system of claim 1, wherein the flexible thermal strap comprises graphite.

5. The heat transfer system of claim 1, wherein at least one of the planar layers is a graphite sheet.

6. The heat transfer system of claim 5, wherein each of the planar layers is a graphite sheet.

7. The heat transfer system of claim 1, wherein the flexible thermal strap is configured to permit the second vapor chamber to rotate through a range of at least 90 degrees relative to the first vapor chamber.

8. The heat transfer system of claim 1, wherein the flexible thermal strap is configured to permit the second vapor chamber to rotate through a range of at least 180 degrees relative to the first vapor chamber.

9. The heat transfer system of claim 1, further comprising a display in thermal communication with either or both the first vapor chamber and the second vapor chamber;
   wherein the display is foldable to different shapes corresponding to different rotational positions of the second vapor chamber relative to the first vapor chamber.

10. The heat transfer system of claim 1, wherein the first axial end of the flexible thermal strap is in contact with the end of the first vapor chamber and the second axial end of the flexible thermal strap is in contact with the end of the second vapor chamber.

11. The heat transfer system of claim 1, wherein the first axial end of the flexible thermal strap is coextensive with the end of the first vapor chamber and the second axial end of the flexible thermal strap is coextensive with the end of the second vapor chamber.

12. The heat transfer system of claim 1, wherein the axis is a longitudinal axis of the flexible thermal strap.

13. A heat transfer system comprising:
    a first heat exchanger configured to be fixed to a first portion of a mobile device;

a second heat exchanger configured to be fixed to a second portion of the mobile device; and a thermal strap coupled to both the first heat exchanger and the second heat exchanger, the thermal strap having at least one layer of graphite core material, wherein the thermal strap is configured to flex when the mobile device is flexed;

wherein the first heat exchanger includes a first recess to receive one end of the thermal strap, and wherein the second heat exchanger includes a second recess to receive an opposite end of the thermal strap.

14. The heat transfer system of claim 13, wherein the mobile device comprises a portable phone.

15. The heat transfer system of claim 13, wherein the thermal strap is disposed between the first heat exchanger and the second heat exchanger in at least one rotational position of the first heat exchanger with respect to the second heat exchanger.

16. The heat transfer system of claim 13, wherein the thermal strap includes planar layers of thermally-conductive material.

17. The heat transfer system of claim 13, wherein the thermal strap is configured to permit the second heat exchanger to rotate through a range of at least 90 degrees relative to the first heat exchanger.

18. The heat transfer system of claim 13, wherein the thermal strap is configured to permit the second heat exchanger to rotate through a range of at least 180 degrees relative to the first heat exchanger.

19. The heat transfer system of claim 13, wherein the first heat exchanger is a vapor chamber having a first rectangular frame that defines a first evaporator region along a top side of the first rectangular frame and a condenser region along a bottom side of the first rectangular frame, wherein the second heat exchanger is a vapor chamber having a second rectangular frame that defines a second evaporator region along a top side of the second rectangular frame and a condenser region along a bottom side of the second rectangular frame.

20. A heat transfer system comprising:
a first vapor chamber having a first frame, a first top cover sheet extending past an end of the first frame, and a first bottom cover sheet extending past the end of the first frame;
a second vapor chamber having a second frame, a second top cover sheet extending past an end of the second frame, and a second bottom cover sheet extending past the end of the second frame; and
a thermal strap having a first end coupled to the end of the first frame and a second end coupled to the end of the second frame, wherein the first top cover sheet, the second top cover sheet, the first bottom cover sheet, and the second bottom cover sheet each extend over a portion of the thermal strap.

21. The heat transfer system of claim 20, further comprising a display in thermal communication with either or both the first vapor chamber and the second vapor chamber; wherein the display is foldable to different shapes corresponding to different rotational positions of the second vapor chamber relative to the first vapor chamber.

22. A heat transfer system comprising:
a first vapor chamber;
a first top cover sheet coupled to the first vapor chamber;
a second vapor chamber spaced from the first vapor chamber;
a second top cover sheet coupled to the second vapor chamber;
a flexible thermal strap coupled to both the first vapor chamber and the second vapor chamber; and
a via extending through the flexible thermal strap and coupled to both the flexible thermal strap and the first top cover sheet.

23. The heat transfer system of claim 22, wherein the via is a first via, the heat transfer system further comprising a second via extending through the flexible thermal strap and coupled to both the flexible thermal strap and the second top cover sheet.

24. The heat transfer system of claim 22, wherein the via is a conductive column comprised of an isotropic metal.

25. The heat transfer system of claim 22, wherein an end of the via is flush with an exterior surface of the flexible thermal strap.

26. The heat transfer system of claim 22, wherein the via is a pin.

27. The heat transfer system of claim 22, wherein the first top cover sheet includes a mounting aperture, and wherein the via extends through the mounting aperture.

28. The heat transfer system of claim 22, wherein the via is held via an interference fit within the flexible thermal strap.

* * * * *